United States Patent [19]
Rahman

[11] Patent Number: 5,830,990
[45] Date of Patent: *Nov. 3, 1998

[54] LOW METALS PERFLUOROOCTANOIC ACID AND TOP ANTI-REFLECTIVE COATINGS FOR PHOTORESISTS

[75] Inventor: M. Dalil Rahman, Flemington, N.J.

[73] Assignee: Clariant Finance (BVI) Limited, Virgin Islands (Br.)

[ * ] Notice: The term of this patent shall not extend beyond the expiration date of Pat. No. 5,516,886.

[21] Appl. No.: 537,199

[22] Filed: Sep. 29, 1995

Related U.S. Application Data

[63] Continuation of Ser. No. 258,898, Jun. 10, 1994, Pat. No. 5,516,886, which is a continuation of Ser. No. 984,655, Dec. 2, 1992, abandoned, which is a continuation-in-part of Ser. No. 911,604, Jul. 10, 1992, abandoned.

[51] Int. Cl.$^6$ .................................. C08F 6/06; C08J 3/07
[52] U.S. Cl. .......................... 528/482; 430/331; 430/338; 524/319; 524/428; 524/462; 524/463; 524/556; 521/26; 528/490; 528/499
[58] Field of Search .................................. 528/482, 490, 528/499; 524/319, 428, 462, 463, 556; 521/26; 430/331, 338

[56] References Cited

U.S. PATENT DOCUMENTS

| | | | |
|---|---|---|---|
| 2,929,808 | 3/1960 | Ross et al. | 526/79 |
| 4,033,909 | 7/1977 | Papa | 521/131 |
| 4,033,910 | 7/1977 | Papa | 521/131 |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/270 X |
| 4,747,954 | 5/1988 | Vaughn et al. | |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,212,044 | 5/1993 | Liang et al. | 430/270 X |
| 5,284,930 | 2/1994 | Matsumoto et al. | 528/482 |
| 5,286,606 | 2/1994 | Rahman et al. | 430/311 |
| 5,290,666 | 3/1994 | Hashimoto et al. | 430/326 |
| 5,300,628 | 4/1994 | Honda | 528/482 |
| 5,350,714 | 9/1994 | Trefonas, III et al. | 210/663 X |
| 5,370,825 | 12/1994 | Angelopoules et al. | 252/500 |
| 5,378,802 | 1/1995 | Honda | 210/660 X |
| 5,446,125 | 8/1995 | Honda et al. | 528/486 |
| 5,472,616 | 12/1995 | Szmanda et al. | 210/683 |
| 5,500,127 | 3/1996 | Carey et al. | 210/685 |
| 5,516,886 | 5/1996 | Rahman et al. | 524/462 |
| 5,521,052 | 5/1996 | Rahman et al. | 430/270.1 |

FOREIGN PATENT DOCUMENTS

| | | |
|---|---|---|
| 544324 | 6/1993 | European Pat. Off. . |
| 544325 | 6/1993 | European Pat. Off. . |
| A-0588492 | 3/1994 | European Pat. Off. . |
| 1072155 | 3/1989 | Japan . |
| 1228560 | 9/1989 | Japan . |
| 4-65415 | 3/1992 | Japan . |
| 1509354 | 5/1978 | United Kingdom . |
| WO 90/01726 | 2/1990 | WIPO . |
| WO 93/12152 | 6/1993 | WIPO . |
| WO 93/18437 | 9/1993 | WIPO . |
| WO 94/01807 | 1/1994 | WIPO . |
| WO 94/12912 | 6/1994 | WIPO . |
| WO 94/14858 | 7/1994 | WIPO . |
| WO 94/14863 | 7/1994 | WIPO . |
| WO 95/10798 | 4/1995 | WIPO . |
| WO 96/12214 | 4/1996 | WIPO . |
| WO 96/20965 | 7/1996 | WIPO . |
| WO 96/21175 | 7/1996 | WIPO . |
| WO 96/21176 | 7/1996 | WIPO . |
| WO 91/12280 | 4/1997 | WIPO . |
| WO 97/11929 | 4/1997 | WIPO . |
| WO 97/12281 | 4/1997 | WIPO . |
| WO 97/19969 | 6/1997 | WIPO . |

OTHER PUBLICATIONS

Bayard; "Water Free of Heavy Metals for Medical Use and Ion Exchange Resin Used in its Preparation" Nov. 16, 1992; CA98(26):221589z.

Hirai et al; "Treatment of Waste Waters Containing Formaldehyde and Metals with Chelating Ion Exchange Resins"; Nov. 5, 1975; CA84(14):95328j.

G. Noti et al, "Deionized Water Plants for Semiconductor Device Fabrication", Proceedings of the Inst:Radio and Electron. Eng, Aust.(Australia),vol. 34, No. 2, Mar. 1973, pp. 45–51.

Derwent Publications Ltd., London, GB; JP–A–05 234 876 (OCG Microelectronic Materials), Sep. 10, 1993.

Derwent Publ., JP–A–06 289 620(Hitachi Chemical Co., Ltd.) Oct. 18, 1994.

Rohm and HAAS Company; "Amberlite Ion Exchange Resins Laboratory Guide"; Sep. 1979; Philadelphia, PA.

JP–A–1190713 Inatomi, Shigeki et al, Jul. 31, 1989; Chemcial Abstracts, vol. 112, No. 18, Apr. 30, 1990, Columbus, OH, p. 17, the Abstract 15920lu.

Kimura et al; "Purification of Formaldehyde"; Mar. 9, 1977; CA87(7):52776y.

T. Tanada; "A New Photolithography Tech. with Antireflective . . . "; Journal of the Electrochemical Society, vol. 137, No. 12, pp. 393900–3905; Dec. 1990, Manchester, New Hampshire.

*Primary Examiner*—Peter A. Szekely
*Attorney, Agent, or Firm*—Andrew F. Sayko, Jr.

[57] ABSTRACT

The present invention provides methods for producing top anti-reflective coating compositions having a very low level of metal ions, utilizing a specially washed and modified ion exchange resin. A method is also provided for producing semiconductor devices using such ion exchange treated top anti-reflective coating compositions.

11 Claims, No Drawings

LOW METALS PERFLUOROOCTANOIC ACID AND TOP ANTI-REFLECTIVE COATINGS FOR PHOTORESISTS

This application is a continuation of U.S. Pat. No. 5,516,886 issued on May 4,1996, to Rahman et al, based upon U.S. application Ser. No. 258,898, filed on Jun. 10, 1994, which is a continuation of U.S. application Ser. No. 984,655, filed on Dec. 2, 1992, now abandoned, which is a continuation-in-part of U.S. application Ser. No. 911,604, filed Jul. 10, 1992, now abandoned.

BACKGROUND OF THE INVENTION

The present invention relates to a process for producing perfluorooctanoic acid having a very low level of metal ions, to produce a top anti-reflective coatings having a low level of metal ions, especially sodium and iron, and for using such top anti-reflective coatings with light-sensitive photoresist compositions to produce semiconductor devices. The present invention further relates to a process for coating substrates already coated with a photoresist composition with these top antireflective coating compositions, as well as the process of coating, imaging and developing light-sensitive photoresist compositions coated with such anti-reflective coatings on such substrates.

Thin film interference plays a central role in the process control of optical microlithography. Small variations in the thickness of photoresist or of thin films underneath the photoresist cause large exposure variations, which in turn cause two classes of undesirable line width variations.

1. As thin film thickness may vary from run to run, wafer to wafer, or across a wafer, line widths will vary from run to run, wafer to wafer or across a wafer.
2. As patterning takes place over wafer topography, the photoresist thickness unavoidably changes at the topography edge causing the line width to vary as it crosses the edge.

Avoiding such thin film interference effects is one of the key advantages of advanced processes such as X-Ray lithography or multi-layer photoresist systems. However, Single Layer Photoresist (SLR) processes dominate semiconductor manufacturing lines because of the their simplicity and cost-effectiveness, and also because of the relative cleanliness of wet developed processes compared with dry processes.

Thin film interference results in periodic undulations in a plot of the exposure dose required to clear positive photoresist (termed dose-to-clear) versus the photoresist thickness. Optically, on a photoresist-coated substrate, light reflected from the bottom mirror (due to the effect of the substrate +thin films) interferes with the refection of the top mirror (the photoresist/air interface).

As optical lithography pushes towards shorter wavelengths, thin film interference effects become increasingly important. More severe swings in intensity are seen as wavelength decreases.

One strategy for reducing thin film interference is to reduce the substrate reflectivity through the use of absorptive Anti-Reflective Coats. One way of doing this is to apply a Top Anti-Reflective coating on top of the photoresist, prior to exposure.

Photoresist compositions are used in micro-lithography processes for making miniaturized elec-tronic components, such as in the fabrication of computer chips and integrated circuits. Generally, in these processes, a thin coating of film of a photoresist composition is first applied to a substrate material, such as silicon wafers used for making integrated circuits. The coated substrate is then baked to evaporate solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-Ray radiant energy are radiation types commonly used today in microlithographic processes. After this image-wise exposure, the coated substrate is treated with a developer solution to dissolve and remove either the radiation-exposed or the unexposed areas of the photoresist and all of the anti-reflective coating from the surface of the substrate.

Metal ion contamination has been a problem for a long time in the fabrication of high density integrated circuits and computer chips, often leading to increased defects, yield losses, degradation and decreased per-formance. In plasma processes, metal ions such as sodium and iron, when they are present in the photoresist or in a coating on the photoresist, can cause contamination, especially during plasma stripping. However, these problems have been overcome, to a substantial extent, during the fabrication process, for example, by utilizing HCl gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems can be the metal contamination in the anti-reflective coating on the photoresist, particularly sodium and iron ions. Metal ion levels of as low as 1.0 ppm or less can adversely affect the properties of such semiconductor devices.

There are two types of photoresist compositions, negative-working and positive-working. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface.

In some instances, it is desirable to heat treat the remaining photoresist layer, after the development step and before the etching step, to increase its adhesion to the underlying substrate and its photoresistance to etching solutions. Positive working photoresist compositions are currently favored over negative working photoresists because the former generally have better resolution capabilities and pattern transfer characteristics.

Photoresist resolution is defined as the smallest feature which the photoresist composition can transfer from the photomask to the substrate, with a high degree of image edge acuity after exposure and development. In many manufacturing applications today, photoresist resolution on the order of substantially less then one micron are necessary. In addition, it is almost always desirable that the developed photoresist wall profiles be near vertical, relative to the substrate. Such demarcations between developed and undeveloped areas of the photoresist coating translate into accurate pattern transfer of the mask image onto the substrate.

DESCRIPTION OF THE PRIOR ART

In copending U.S. patent application Ser. No. 984,655 filed on Dec. 2, 1992 now abandoned, but it is continuation 258,898 filed Jul. 10, 1994 is now U.S. Pat. No. 5,516,886 assigned to the same assignee as the subject application and incorporated herein by reference, a process to produce a top anti-reflective coating having a low level of metal ions by removing metals from a water soluble polymeric carboxylic acid by acidic ion exchange resin is disclosed. U.S. Pat. 5,370,825 which is incorporated here in by reference, describes water soluble electrically conductive polymeric compositions as electrical discharge layers, e,g., for electron beam lithography and scanning electron microscope inspection, photoresists and coatings. Japanese patent JP-06289620-A describes a compositions which contains poly(vinyl methylether) resin and a fluorine type water soluble surfactant which is coated on a photoresist film. None of these patents describe how to produce very low metal ion containing top anti-reflecting coating composition.

SUMMARY OF THE INVENTION

The present invention relates to a process for producing a top anti-reflective coating containing a very low level of metal ions, especially sodium and iron. The invention further relates to a process for producing semiconductor devices using such a top anti-reflective coating for a photoresist.

The process of the subject invention provides a top anti-reflective coating having a very low level of metal ions. The anti-reflective coating is applied on top of a photoresist, which may be either negative or positive working, although positive photoresists are preferred.

The top anti-reflective coatings obtained have a very low level of metal ions such as iron, sodium, potassium, calcium, magnesium, copper and zinc. Sodium and iron are the most common metal ion contaminants and among the easiest to detect. The level of these metal ions serves as an indicator of the level of other metal ions. The level of sodium and iron ions, are each respectively, less than 200 ppb, preferably less than 100 ppb, more preferably less than 50 ppb, even more preferably less than 20 ppb, and most preferably less than 10 ppb.

DETAILED DESCRIPTION OF THE PREFERRED EMBODIMENT

The present invention relates to a process for producing perfluorooctanoic acid having a very low level of metal ions and to a process for producing a top anti-reflective coating composition having a very low level of metal ions, particularly sodium and iron. In the preferred embodiment, the process utilizes a modified acidic ion exchange resin to purify the perfluorooctanoic acid and top anti-reflective coating.

The subject process comprises:

a) washing an acidic ion exchange resin with deionized (DI) water, followed by a mineral acid solution (e.g. a 5–98% solution of sulfuric, nitric or hydrochloric acid) and again with deionized water, until the conductivity of the effluent is same as deionized water, to thereby reduce the level of sodium and iron ions in the ion exchange resin to less than 500 ppb each, preferably less than 200 ppb, more preferably less than 100 ppb, and most preferably less than 50 ppb; washing the acidic ion exchange resin with 1 to 10% of a non-metal ion alkaline solution, such as an ammonium hydroxide, such as tetramethyl ammonium hydroxide (TMAH) solution, to thereby convert the acidic ion exchange resin to the alkaline form of acidic ion exchange resin;

b) providing a solution of 2 to 40 weight percent of perfluorooctanoic acid in said alkaline solution, preferably 2.38% TMAH;

c) passing the perfluorooctanoic acid solution through the treated acidic ion exchange resin and thereby reducing the level of total sodium and iron ions in the solution to less than 200 ppb each, preferably less than 100 ppb, more preferably less than 50 ppb, even more preferably less than 20 ppb and most preferably less than 10 ppb;

d) washing a second acidic ion exchange resin with deionized water, followed by a mineral acid solution (e.g. a 5–98% solution of sulfuric, nitric or hydrochloric acid) and again with deionized water to thereby reduce the level of sodium and iron ions in the second acidic ion exchange resin to less than 500 ppb each, preferably less than 200 ppb, more preferably less than 100 ppb and most preferably no more than 50 ppb;

e) providing a solution of 5 to 40 weight percent of a water soluble organic carboxylic acid polymer having a weight average molecular weight (as determined by GPC) of from about 500 to about 100,000, preferably from about 1,000 to about 10,000, in a suitable solvent;

f) passing the water soluble organic carboxylic acid polymer solution through the second acidic ion exchange resin and thereby reducing the level of total sodium and iron ions in the solution to less than 200 ppb each, preferably less than 100 ppb, more preferably less than 50 ppb, even more preferably less than 20 ppb and most preferably less than 10 ppb;

g) formulating a top anti-reflective coating composition by providing an admixture of:
 (1) the treated water soluble organic carboxylic acid;
 (2) the treated perfluorooctanoic acid (0.1%–10% by weight in deionized water, preferably 0.5%–5% by weight)
 (3) an ammonium hydroxide; and
 (4) a suitable solvent.

The present invention provides a process for producing perfluorooctanoic acid having a very low level of metal ions and for producing a top anti-reflective coating composition having a very low level of metal ions, particularly sodium and iron. In the preferred embodiment, the process utilizes a modified acidic ion exchange resin to purify the perfluorooctanoic acid and top anti-reflective coating.

The subject process comprises:

a) distilling perfluorooctanoic acid under mild vacuum at a pressure of from about 400 mm to 700 mm Mercury, preferably from about 200 mm to 300 mm Mercury, to thereby reduce the level of metal ions to less than 100 ppb each, preferably less than 50 ppb each;

b) washing an acidic ion exchange resin with deionized water, followed by a mineral acid solution (e.g. a 5–98% solution of sulfuric, nitric or hydrochloric acid) and again with deionized water, to thereby reduce the level of sodium and iron ions in the ion exchange resin to less than 500 ppb each, preferably less than 200 ppb, more preferably less than 100 ppb and most preferably less than 50 ppb;

c) providing a solution of 5 to 40 weight percent of a water soluble organic carboxylic acid polymer having a weight average molecular weight (GPC) of from about 500 to about 100,000, preferably from about 1,000 to about 10,000, in a suitable solvent;

d) passing the water soluble organic carboxylic acid polymer solution through the acidic ion exchange resin and thereby reducing the level of sodium and iron ions in the solution to less than 200 ppb each, preferably less than 100 ppb, more preferably less than 50 ppb, even more preferably less than 20 ppb and most preferably less than 10 ppb;

(e) formulating a top anti-reflective coating composition by providing an admixture of:
 (1) the treated water soluble organic carboxylic acid;
 (2) the treated perfluorooctanoic acid (0.1%–10% by weight in water, preferably 0.5%–5% by weight)
 (3) an ammonium hydroxide; and
 (4) a suitable solvent.

After the formulation of a top anti-reflective coating composition, if the composition should get contaminated by metal ions, a preferred method to purify such a composition is by:

a) washing an acidic ion exchange resin with deionized water, followed by a mineral acid solution (e.g. a 5–98% solution of sulfuric, nitric or hydrochloric acid) and again with deionized water, until the conductivity of the effluent is the same as deionized water, to thereby reduce the level of sodium and iron ions in the ion exchange resin to less than 500 ppb each, preferably less than 200 ppb, more preferably less than 100 ppb and most preferably less than 50 ppb; washing the acidic ion exchange resin with 1 to 10% of a non-metal ion alkaline solution, such as an ammonium hydroxide, such as TMAH solution, to thereby convert the acidic ion exchange resin to the alkaline form of acidic ion exchange;

b) passing the contaminated anti-reflective coating through the modified acidic ion exchange resin (alkaline form) to thereby reduce the level of metal ions to less than 100 ppb each, preferably less than 50 ppb, even more preferably less than 20 ppb, and most preferably less than 10 ppb.

An acidic ion exchange resin, such as a styrene/divinylbenzene cation (acidic) exchange resin, is utilized in the present process. Such ion exchange resins are available from Rohm and Haas Company, e.g. AMBERLYST® 15 resin. These resins typically contain as much as 80,000 to 200,000 ppb each of sodium and iron. Before being utilized in the process of the present invention, the cation exchange resin must first be treated with DI water and then a mineral acid solution to reduce the metal ion level. Preferably the ion exchange resin is initially rinsed with deionized water, followed by a mineral acid solution, such as a 10 percent sulfuric acid solution, rinsed again with deionized water, treated again with the mineral acid solution, and once more rinsed with deionized water. Before purifying the antireflective coating composition solution, it is critical that the ion exchange resin is first rinsed with a solvent which is compatible with the antireflective coating composition solvent.

If the anti-reflective coating composition or any of its components contains one or more constituents which will react chemically with the acidic ion exchange resin, the anti-reflective coating or component is preferably initially formulated without such constituents, e.g. the ammonium hydroxide. This will provide an anti-reflective coating composition, or component, substantially free of any constituents which will react with the acidic ion exchange resin. After purification, such constituents are added to the anti-reflective coating composition.

The solution of the anti-reflective coating composition, or component, is passed through a column containing the acidic ion exchange resin, e.g. a solution of from about 1 to 40 weight percent in a suitable solvent. Such solutions may typically contain from 500 to 20,000 ppb each of sodium and iron ions. During the process of the present invention, these levels are each reduced to as low as 10 ppb each, or less.

The present invention provides a process for producing a top anti-reflective coating composition having a very low level of metal ions and a process for producing semiconductor devices using such anti-reflective coatings. The anti-reflective coating is formed by providing an admixture of a water soluble organic carboxylic acid, a sparingly water-soluble halogen containing organic aliphatic carboxylic acid, an ammonium hydroxide and a suitable solvent.

Suitable water soluble organic carboxylic acids include acrylic and methacrylic acids, such as a poly(acrylic acid) and a poly(methacrylic acid). Suitable sparingly water soluble fluorine containing organic aliphatic carboxylic acids include fluorinated $C_3$–$C_{18}$ is aliphatic carboxylic acids, such as penta-decafluorooctanoic acid.

Suitable solvents, which are preferably deionized, include water, diglyme, propylene glycol monoethyl ether acetate (PGMEA), ethyl lactate, ethyl-3-ethoxypropionate, mixtures of ethyl lactate and ethyl-3-ethoxy propionate, xylene, butyl acetate cyclopentanone, cyclohexanone and ethylene glycol monoethyl ether acetate.

The solvents may be present in the overall composition in an amount of from about 75% to about 98% by weight of the solids in the composition. Solvents, of course, are substantially removed after coating of the top anti-reflective coating on a substrate and drying.

The present invention also provides a process for producing semiconductor devices using such a top anti-reflective coating composition having a very low level of metal ions, particularly sodium and iron. In the preferred embodiment, the process utilizes an acidic ion exchange resin to purify the top anti-reflective coating. The subject process comprises:

a) washing an acidic ion exchange resin with deionized water, followed by a mineral acid solution (e.g. a 5–98% solution of sulfuric, nitric or hydrochloric acid) and again with deionized water, until the conductivity of the effluent is same as deionized water, to thereby reduce the level of sodium and iron ions in the ion exchange resin to less than 500 ppb each, preferably less than 200 ppb, more preferably less than 100 ppb and most preferably less than 50 ppb; washing the ion exchange with 1 to 10% of a non-metal ion alkaline solution, such as an ammonium hydroxide, such as TMAH solution to thereby convert the acidic ion exchange resin to the alkaline form of acidic ion exchange resin;

b) providing a solution of 2 to 40 weight percent of perfluorooctanoic acid in said alkaline solution, preferably 2.38% TMAH);

c) passing the perfluorooctanoic acid solution through the acidic ion exchange resin and thereby reducing the level of total sodium and iron ions in the solution to less than 200 ppb each, preferably less than 100 ppb, more preferably less than 50 ppb, even more preferably less than 20 ppb and most preferably less than 10 ppb;

d) washing a second acidic ion exchange resin with deionized water, followed by a mineral acid solution (e.g. a 5–98% solution of sulfuric, nitric or hydrochloric acid)and again with deionized water, to thereby reduce the level of sodium and iron ions in the second acidic ion exchange resin to less than 500 ppb each, preferably less than 200 ppb, more preferably less than 100 ppb and most preferably less than 50 ppb;

e) providing a solution of 5 to 40 weight percent of a water soluble organic carboxylic acid polymer having a weight average molecular weight (GPC) of from about 500 to about 100,000, preferably from about 1,000 to about 10,000, in a suitable solvent;

f) passing the water soluble organic carboxylic acid polymer solution through the second acidic ion exchange resin and thereby reducing the level of total sodium and iron ions in the solution to less than 200 ppb each, preferably less than 100 ppb, more preferably less than 50 ppb, even more preferably less than 20 ppb and most preferably less than 10 ppb;

g) formulating a top anti-reflective coating composition by providing an admixture of:
  (1) the treated water soluble organic carboxylic acid;
  (2) the treated perfluorooctanoic acid (0.1%–10% by weight in deionized water, preferably 0.5%–5% by weight)
  (3) an ammonium hydroxide; and
  (4) a suitable solvent.

The prepared top anti-reflective coating is then applied to a suitable substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The top anti-reflective coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The top anti-reflective coating is coated onto the substrate over the photoresist composition, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist and anti-reflective coating, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The substrate is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are then developed to remove the image-wise exposed areas such as by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium hydroxides. One preferred hydroxide is tetramethyl ammonium hydroxide. After removal of the coated wafers from the developing solution, one may conduct an optional post-development heat treatment or bake to increase the coating's adhesion and chemical photoresistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

AMBERLYST® 15 ion exchange resin beads were placed in a conical flask and deionized water was added so that all of the resin beads were under water. The flask were sealed and allowed to stand overnight to swell the resin beads. The next morning the water was decanted, deionized water was again added to cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom. The bed volume was measured as 100 ml. A 10 percent sulfuric acid solution (6 bed volumes) was passed down through the resin bed at a rate of about 10 ml. per minute was then allowed to pass through the resin bed at about the same rate. The pH of the effluent water was measured to assure that it matched the pH of 6 for fresh deionized water. Three bed volumes of 2.38% tetramethylammonium hydroxide (TMAH) were passed through the column.

A top anti-reflective coating (1000 grams) containing 3.35 weight percent of perfluorooctomatic acid, 1.65 weight percent of polyacrylic acid, 1.0 weight percent of tetramethyl ammonium hydroxide and 94.0 weight percent of deionized water was passed through the above column. The untreated top anti-reflective coating had a metal ion content as follows: 23 ppb sodium, 99 ppb iron and 98 ppb chromium. The treated materials had a metal ion content as follows: sodium—19 ppb, iron—43 ppb, and chromium 29 —ppb.

EXAMPLE 2

Example 1 was repeated and the sodium and iron ion levels were measured both before and after treatment of the top anti-reflective coating, as shown below:

| Metals | Before | After |
| --- | --- | --- |
| Na | 79 | 5 |
| Fe | 28 | <5 |

EXAMPLE 3

Example 2 was repeated and the sodium and iron ion levels were measured both before and after treating the top anti-reflecting coating composition, as shown below:

| Metals | Before | After |
| --- | --- | --- |
| Na | 46 | <5 |
| Fe | 33 | 15 |

EXAMPLE 4

18 pounds of AMBERLYST® 15 ion exchange resin beads which were rinsed with deionized water were placed in a 0.5 cubic foot canister, (bed volume 3.5 gal.) The canister was connected through a pump to a drum with a stainless steel tube. 25 gal. of 10 percent sulfuric acid was passed through the canister using a pump, at a rate of 0.35 gal. per minute, residence time 10 minutes. 200 gal. of deionized water was passed through the canister at the same rate to remove the sulfuric acid, until the pH of the effluent was equal to the pH of the deionized water. Three bed volumes of TMAH (2.38% in DI water) were passed through the canister at the same rate as above. 100 gal. of top anti-reflective coating having sodium ion level of 23 ppb, an iron level of 99 ppb, a potassium ion level of ppb, a chromium ion level of 98 ppb and a calcium ion level of ppb and were passed through the resin canister at the same rate and collected in a clean drum. The top antirflective coating obtained had a level of metal ions as follows: sodium—46 ppb, iron—31 ppb, potassium—33 ppb, calcium—19 ppb and chromium—39 ppb, and copper—7 ppb.

EXAMPLE 5

AMBERLYST® 15 ion exchange resin beads were placed in a conical flask and deionized water was added so that all of the resin beads were under water. The flask were sealed and allowed to stand overnight to swell the resin beads. The next morning the water was decanted, deionized water was again added to cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom. The bed volume was measured as 100 ml. A 10 percent sulfuric acid solution (6 bed volumes) was passed down through the resin bed at a rate of about 10 ml. per minute, and was then allowed to pass through the resin bed at about the same rate. The pH of the effluent water was measured to assure that it matched the pH of 6 for fresh deionized water. Three bed volumes of 2.38% TMAH were passed through the column. 120 g of perfluorooctanoic acid (FC-26®, available from 3M Corp.) was added to 375 g of DI water with stirring, and 1200 g of 2.38% TMAH was added to dissolve the perfluorooctanoic acid (FC-26®, available from 3M Corp.). 2.5 bed volumes of above FC-26® solution was passed through the column to remove TMAH. Each bed volume was collected separately to test for metal ions. The residence time in the column was 13 minutes. Metal ion levels both before and after treatment were measured, as shown below:

| Metals | Control | First Sample | Second Sample | Third Sample |
| --- | --- | --- | --- | --- |
| Na | 86 | 8 | 8 | 6 |
| Fe | 42 | <5 | 9 | 13 |

EXAMPLE 6

Perfluorooctanoic acid was distilled under vacuum, at 200 mm pressure and 162° C. The metal ion content both before and after distillation was measured and is shown below:

| Metals | Before Distillation | After Distillation |
| --- | --- | --- |
| Na | 785 | 20 |
| Fe | 67 | 12 |

EXAMPLE 7

17 pounds of AMBERLYST® 15 ion exchange resin beads were rinsed with deionized water and placed in a 0.45 cubic foot canister. The canister was connected through a pump to a drum with a stainless steel tube. 25 gal. of 10 percent sulfuric acid was passed through the canister using a pump, at a rate of 0.35 gal. per minute. 200 gal. of deionized water was passed through the canister at the same rate to remove the sulfuric acid until the pH of the effluent was equal to the pH of the deionized water. 200 gal. of a 10 weight percent polyacrylic acid solution in deionized water was prepared. The solution had a sodium ion level of 360 ppb, an iron ion level of 190 ppb, a potassium ion level of 600 ppb, a chromium ion level of 20 ppb and a calcium ion level of 2600 ppb. This solution was passed through the resin canister at the same rate and collected in a clean drum. The polyacrylic acid solution obtained had a low level of metal ions as follows: sodium—93 ppb, iron—20 ppb, potassium—13 ppb, calcium—74 ppb and chromium—9 ppb.

EXAMPLE 8

A solution was prepared from 3.35 weight percent of the treated perfluorooctanoic acid of Example 6, 1.65 weight percent of the treated polyacrylic acid of Example 7, 1.0 weight percent of tetramethylammonium hydroxide and 94.0 weight percent deionized water. The anti-reflective coating composition obtained had a low level of metal ions as follows: sodium—12 ppb and iron—18 ppb, potassium—14 ppb, chromium—5 ppb, copper—<5 ppb, nickel—<5 ppb, calcium 22 ppb, aluminium—20 ppb, magnessium—5 ppb, and manganese—14 ppb.

The coating composition was capable of forming a 717Å (Angstrom) film at 4000 RPM with a refractive index of 1.41 for the coated film.

EXAMPLE 9

Example 8 was repeated and the anti-reflective coating obtained had a low level of metal ions as follows: sodium—<5 ppb, iron—19 ppb, potassium—<5 ppb, chromium—19 ppb, copper—<5 ppb, nickel—<5 ppb, calcium 24 ppb, and manganese—10 ppb.

What is claimed is:

1. A process for producing a top anti-reflective coating having a very low level of metal ions comprising:
    a) washing an acidic ion exchange resin with deionized water, washing said acidic ion exchange resin with a mineral acid solution and thereby reducing the level of sodium and iron ions in the acidic ion exchange resin to less than 500 ppb each;
    b) providing a solution of 5 to 40 weight percent of a water soluble organic carboxylic acid polymer having a weight average molecular weight of from about 500 to about 100,000, in a suitable solvent;
    c) passing the water soluble organic carboxylic acid polymer solution through the washed acidic ion exchange resin and thereby reducing the level of sodium and iron ions in said solution to less than 200 ppb each;
    d) formulating a top anti-reflective coating composition by providing an admixture of:
        (1) the treated water soluble organic carboxylic acid polymer;
        (2) a fluorine containing organic $C_3$–$C_{13}$ aliphatic carboxylic acid;
        (3) an ammonium hydroxide; and
        (4) a suitable solvent.

2. The method of claim 1 comprising, prior to formulating the top anti-reflective coating composition: washing an acidic ion exchange resin with deionized water, washing said acidic ion exchange resin with a mineral acid solution and thereby reducing the level of sodium and iron ions in said ion exchange resin to less than 500 ppb each; washing said acidic ion exchange resin with an ammonium hydroxide solution, followed by washing with deionized water, passing the fluorine containing organic aliphatic carboxylic acid solution through said washed acidic ion exchange resin, and thereby reducing the level of sodium and iron ions in said carboxylic acid solution to less than 100 ppb each.

3. The method of claim 1 further comprising, prior to formulating the top anti-reflective coating composition, distilling under vacuum a solution of the fluorine containing organic aliphatic carboxylic acid, and thereby reducing the level of sodium and iron ions in said solution to less than 50 ppb each.

4. The method of claim 1 further comprising, after formulating the final top anti-reflective coating composition:
    a) washing an acidic ion exchange resin with deionized water, washing said acidic ion exchange resin with a mineral acid solution and thereby reducing the level of sodium and iron ions in the acidic ion exchange resin to less than 500 ppb each; washing said acidic ion exchange resin with an ammonium hydroxide solution, followed by washing with deionized water;
    b) passing the anti-reflective coating composition through said washeded acidic ion exchange resin and thereby reducing the metal ion level to less than 50 ppb each.

5. The method of claim 1 wherein the level of total sodium and iron ions in the acidic ion exchange resin is reduced to less than 200 ppb each.

6. The method of claim 4 wherein the level of sodium and iron ions in the acidic ion exchange resin is reduced to less than 100 ppb each.

7. The method of claim 1 wherein the sodium and iron ion level in the top anti-reflective coating composition is reduced to less than 100 ppb each.

8. The method of claim 1 wherein the sodium and iron ion level in the top anti-reflective coating composition is reduced to less than 50 ppb each.

9. The method of claim 1 wherein the washed acidic ion exchange resin has a sodium and iron ion level of less than 100 ppb each and the resulting anti-reflective coating composition solution has a sodium and iron level of less than 50 ppb each.

10. The method of claim 1 further comprising, prior to the acidic ion exchange resin washing of: 1) the water soluble organic carboxylic acid polymer, 2) the halogen containing organic aliphatic carboxylic acid or 3) the admixture of these two components; washing the acidic ion exchange resin with a solvent which is compatible with the solvent for the component or mixture of components which is to be treated with the washed acidic ion exchange resin.

11. The method of claim 1 wherein the washed ion exchange resin has a sodium and iron ion level of less than 50 ppb each and the resulting top anti-reflective coating has a sodium and iron ion level of less than 20 ppb each.

* * * * *